(12) United States Patent
Matsui

(10) Patent No.: US 7,186,654 B2
(45) Date of Patent: Mar. 6, 2007

(54) CHEMICAL MECHANICAL POLISHING SLURRY AND METHOD OF MANUFACTURING SEMICONDUCTOR DEVICE BY USING THE SAME

(75) Inventor: Yukiteru Matsui, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/369,647

(22) Filed: Feb. 21, 2003

(65) Prior Publication Data

US 2004/0115944 A1    Jun. 17, 2004

(30) Foreign Application Priority Data

Dec. 13, 2002  (JP)  ............. 2002-362607

(51) Int. Cl.
*H01L 21/302* (2006.01)
*H01L 21/304* (2006.01)
*H01L 21/461* (2006.01)
*C09K 3/14* (2006.01)

(52) U.S. Cl. ............ 438/693; 438/959; 51/298; 51/307; 501/127; 216/52; 106/3

(58) Field of Classification Search ........ 438/689, 438/690, 691, 692, 693, 626, 631, 633, 687, 438/688, 959; 51/298, 307; 216/52; 501/127; 106/3
See application file for complete search history.

(56) References Cited

U.S. PATENT DOCUMENTS

| | | | | |
|---|---|---|---|---|
| 5,523,074 A | * | 6/1996 | Takahashi et al. | 423/625 |
| 5,527,423 A | * | 6/1996 | Neville et al. | 438/693 |
| 5,607,718 A | * | 3/1997 | Sasaki et al. | 427/97 |
| 5,693,239 A | * | 12/1997 | Wang et al. | 216/88 |
| 5,775,980 A | * | 7/1998 | Sasaki et al. | 451/285 |
| 5,776,214 A | * | 7/1998 | Wood | 51/309 |
| 6,139,763 A | * | 10/2000 | Ina et al. | 216/89 |
| 6,238,450 B1 | * | 5/2001 | Garg et al. | 51/309 |
| 6,251,150 B1 | * | 6/2001 | Small et al. | 51/307 |
| 6,258,137 B1 | | 7/2001 | Garg et al. | |
| 6,277,161 B1 | * | 8/2001 | Castro et al. | 51/309 |
| 6,375,545 B1 | * | 4/2002 | Yano et al. | 451/36 |
| 6,436,811 B1 | * | 8/2002 | Wake et al. | 438/633 |
| 6,440,187 B1 | * | 8/2002 | Kasai et al. | 51/309 |
| 6,454,819 B1 | * | 9/2002 | Yano et al. | 51/298 |
| 6,478,834 B2 | * | 11/2002 | Tsuchiya et al. | 51/307 |
| 6,576,554 B2 | * | 6/2003 | Matsui et al. | 438/693 |
| 7,067,105 B2 | * | 6/2006 | Kogoi et al. | 423/625 |

(Continued)

FOREIGN PATENT DOCUMENTS

EP   1 020 501 A2 *  7/2000
EP   1 036 836 A1 *  9/2000
JP   11-511394       10/1999

(Continued)

OTHER PUBLICATIONS

Matsui et al (JP 200-269169) (cited on IDS) (Translation).*
Hiroyuki Yano, et al. "High-Performance CMP Slurry with Inorganic/Resin Abrasive for AL/Low K Damascene," Mat. Res. Soc. Symp. Proc., vol. 671, 2001, Materials Research Society.

(Continued)

*Primary Examiner*—M. Wilczewski
(74) *Attorney, Agent, or Firm*—Oblon, Spivak, McClelland, Maier & Neustadt, P.C.

(57) ABSTRACT

A chemical mechanical polishing slurry contains an alumina powder including α-alumina particles and at least one other alumina particles having a crystal structure different from that of α-alumina, and resin particles.

18 Claims, 2 Drawing Sheets

U.S. PATENT DOCUMENTS

| | | | |
|---|---|---|---|
| 2001/0055558 A1* | 12/2001 | Kogoi et al. | 423/625 |
| 2003/0064020 A1* | 4/2003 | Kogoi et al. | 423/625 |
| 2003/0165412 A1* | 9/2003 | Matsui et al. | 422/245.1 |
| 2004/0065021 A1* | 4/2004 | Yoneda et al. | 51/298 |
| 2004/0115944 A1* | 6/2004 | Matsui | 438/692 |
| 2005/0090104 A1* | 4/2005 | Yang et al. | 438/689 |
| 2005/0132658 A1* | 6/2005 | Celikkaya et al. | 51/307 |
| 2005/0137076 A1* | 6/2005 | Rosenflanz et al. | 501/103 |
| 2005/0137077 A1* | 6/2005 | Bange et al. | 501/127 |
| 2006/0210799 A1* | 9/2006 | Maki et al. | 428/402 |

FOREIGN PATENT DOCUMENTS

| | | |
|---|---|---|
| JP | 2000-204352 | 7/2000 |
| JP | 2000-204353 | 7/2000 |
| JP | 2000-269169 | 9/2000 |
| JP | 2000-269170 | 9/2000 |
| JP | 2001-15462 | 1/2001 |
| JP | 2001-152135 | 6/2001 |
| JP | 2002-30271 | 1/2002 |
| JP | 2004-143429 | 5/2004 |

OTHER PUBLICATIONS

Yukiteru Matsui, et al. "A Novel CMP Slurry with Inorganic/Resin Abrasive for AL Damascene Process," Advanced Metallization Conf. 2001, Conference Proceedings ULSI XVII, 2002, Materials Research Society, p. 693.

* cited by examiner

CHEMICAL MECHANICAL POLISHING SLURRY AND METHOD OF MANUFACTURING SEMICONDUCTOR DEVICE BY USING THE SAME

CROSS-REFERENCE TO RELATED APPLICATIONS

This application is based upon and claims the benefit of priority from the prior Japanese Patent Application No. 2002-362607, filed Dec. 13, 2002, the entire contents of which are incorporated herein by reference.

BACKGROUND OF THE INVENTION

1. Field of the Invention

The present invention relates to a chemical mechanical polishing slurry and a method of manufacturing a semiconductor device by using the same.

2. Description of the Related Art

A buried wiring (damascene wiring) technology is being studied and developed in recent years as a wiring technology in a semiconductor VLSI in order to simplify the wiring process and to improve the yield and the reliability of the wiring. For forming a damascene wiring, a chemical mechanical polishing (CMP) technology constitutes an indispensable important technology.

When it comes to a damascene wiring used widely nowadays, copper having a low resistivity is used mainly as a wiring metal in a high-speed logic device. Aluminum or tungsten is used as a wiring metal in a memory device represented by a DRAM because of the low cost. However, in any of the devices, aluminum having a resistivity nearly close to that of copper is expected to provide a hopeful damascene wiring metallic material in view of both the low resistivity and the low cost.

In the CMP technology, a high polishing rate of the wiring metal, a planarity of the polished surface, and a low defect density on the polished surface are required. However, since the aluminum film is softer than the other damascene wiring metal film such as a copper film or a tungsten film, problems such as, particularly, the scratch and the surface roughness tend to be generated, if a CMP treatment is carried out by using a slurry containing inorganic particles, e.g., alumina particles, as the polishing abrasive grains. The generation of the scratch and the surface roughness markedly lowers the yield of the wiring.

In order to suppress, e.g., the scratch generation in the wiring metal such as aluminum, it is known to the art that a CMP slurry containing resin (polymer) particles mixed with inorganic particles such as alumina particles is used for the CMP treatment, as disclosed in, for example, Japanese Patent Disclosure (Kokai) No. 2000-269169, Japanese Patent Disclosure No. 2000-269170, Japanese Patent Disclosure No. 2001-15462, and Japanese Patent Disclosure No. 2002-30271.

However, it has been found by the research conducted by the present inventor that it is difficult to simultaneously achieve a high polishing rate, a low erosion, a reduced scratch and/or a reduced surface roughness in the case where a CMP treatment is applied to an aluminum film by using the conventional CMP slurry noted above, which contains inorganic particles such as alumina particles and resin (polymer) particles.

BRIEF SUMMARY OF THE INVENTION

According to a first aspect of the present invention, there is provided a CMP slurry comprising an alumina powder including α-alumina particles and at least one other alumina particles having a crystal structure different from that of α-alumina, and resin particles.

According to a second aspect of the present invention, there is provided a method of manufacturing a semiconductor device, comprising forming at least one recess in an insulating layer formed above a semiconductor substrate; forming a layer of a metallic material over the insulating layer, burying the recess; and polishing the metallic material layer by using a CMP slurry until that portion of the metallic material layer which is positioned on the insulating layer is removed, forming a buried wiring layer comprising the metallic material buried in the recess, wherein the CMP slurry comprises an alumina powder including α-alumina particles and at least one other alumina particles having a crystal structure different from that of α-alumina, and resin particles.

DETAILED DESCRIPTION OF THE INVENTION

Figure 1A:
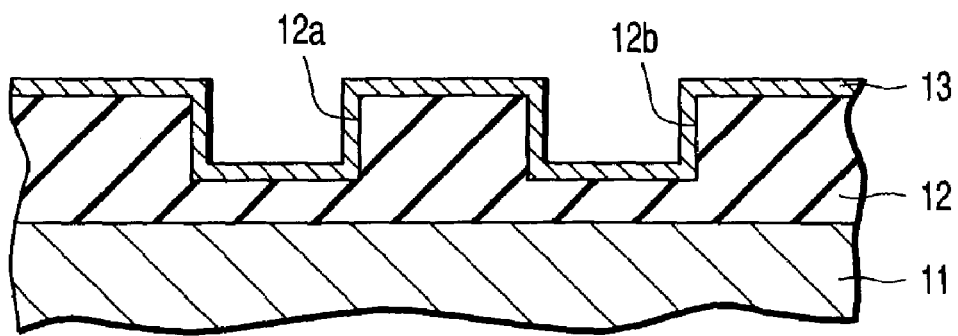
FIGS. 1A to 1C are cross-sectional views collectively showing a method of manufacturing a semiconductor device according to one embodiment of the present invention.

In the research on the CMP technology for polishing an aluminum film by using a CMP slurry containing inorganic particles and resin particles, the present inventor has confirmed that alumina particles, among the inorganic particles, produce an excellent polishing power on the aluminum film, and further continued the research on the CMP slurry containing alumina particles and resin particles. As a result, it has been found for the first time that, in a system in which alumina particles and resin particles coexist, the crystal structure of the alumina greatly affects the polishing performance produced by the CMP slurry on the aluminum film.

More specifically, in the case of using a CMP slurry containing a mixture of resin particles with γ-alumina particles alone, δ-alumina particles alone or θ-alumina particles alone, it was possible to achieve a high polishing rate and a good planarity on the polished surface of the aluminum film. However, it was hardly possible to suppress the occurrence of relatively shallow scratches on the surface of the aluminum film polished. It was also hardly possible to suppress the surface roughness of the aluminum film. On the other hand, in the case of using a CMP slurry containing a mixture of resin particles with α-alumina particles alone, it was possible to suppress the micro-scratch occurrence and the surface roughness of the aluminum film. However, it was hardly possible to achieve a high polishing rate and a good planarity of the polished surface. The present invention is based on these findings, and various embodiments of the present invention will now be described below.

A CMP slurry according to one embodiment of the present invention contains an alumina powder and resin particles. In one embodiment of the present invention, the CMP slurry is water-based, i.e., the CMP slurry is an aqueous slurry.

In one embodiment of the present invention, the alumina powder constitutes abrasive grains for the physical polishing and contains α-alumina particles and at least one other alumina particles having a crystal structure different from that of α-alumina. All the alumina powder used may consist of α-alumina particles and at least one other alumina particles having a crystal structure different from that of α-alumina. In one embodiment of the present invention, at least one other alumina particles used may be selected from the group consisting of γ-alumina particles, δ-alumina particles and θ-alumina particles. γ-alumina particles have been found to be particularly effective for suppressing the erosion of an aluminum film, while δ-alumina particles have been found to be particularly effective for suppressing the surface roughness, for suppressing the erosion and for achieving a high polishing rate, with respect to an aluminum film. Further, θ-alumina particles have been found to be particularly effective for suppressing the surface roughness of the aluminum film polished. The alumina powder may consist of α-alumina particles and γ-alumina particles. In one embodiment of the present invention, it is unnecessary for the alumina powder (α-alumina particles and the other alumina particles) to be covered with a film made of a material other than alumina, e.g., with a silica film. In other words, the alumina powder used in one embodiment of the present invention is free from a surface covering film.

In one embodiment of the present invention, the alumina powder contains α-alumina particles in a proportion of 20 to 80% by weight based on the total amount of the α-alumina particles and at least one other alumina particles. If the proportion of α-alumina particles in the alumina powder is 20% by weight or more, it is possible to suppress the micro-scratch occurrence, to suppress the surface roughness, and to achieve a good planarity on the polished surface, with respect to an aluminum film. On the other hand, if the proportion of α-alumina particles is 80% by weight or less, it is possible to achieve a polishing rate of an aluminum film, which is sufficiently high practically. More desirably, the proportion of α-alumina particles in the alumina powder is 50 to 80% by weight.

In one embodiment of the present invention, it is desirable that the alumina powder, as a whole, have an average primary particle diameter of 5 nm to 100 nm. If the average primary particle diameter of the alumina powder is 5 nm or more, a higher polishing power can be exerted on an aluminum film, achieving a higher polishing rate, and at the same time the scratches are more suppressed on the polished surface of an aluminum film. On the other hand, if the average primary particle diameter of the alumina powder is 100 nm or less, it is possible to further improve the dispersibility of the alumina powder in the slurry.

In one embodiment of the present invention, it is desirable that the alumina powder be contained in the CMP slurry in an amount of 0.1 to 5% by weight. If the alumina powder content in the slurry is 0.1% by weight or more, a sufficiently high polishing power can be exerted on an aluminum film, achieving a higher polishing rate. On the other hand, if the alumina powder content in the slurry is 5% by weight or less, it is possible to ensure a sufficiently high polishing selectivity ratio of aluminum to silicon oxide that is often used to form an insulating layer, i.e., a ratio of the polishing rate of aluminum to the polishing rate of silicon oxide.

The resin particles themselves contained in the CMP slurry according to one embodiment of the present invention is considerably softer than the alumina powder, is inactive or inert and has substantially no polishing power on a metal such as aluminum. However, the resin particles impart a cushioning effect to the alumina powder. When the alumina particles is attached or adhered to the surface of the resin particle, the effective particle diameter of the alumina particle is increased, significantly improving the polishing efficiency. An increase in the particle diameter of the alumina powder itself brings about an increase in the scratch with respect to the wiring metal polished. In order to allow the alumina particles to be attached to the resin particles so as to form aggregates of the resin particles and the alumina particles, it is possible to employ the technique disclosed in, for example, Japanese Patent Disclosure No. 2000-269169, Japanese Patent Disclosure No. 2000-269170, Japanese Patent Disclosure No. 2001-15462, and Japanese Patent Disclosure No. 2002-30271 referred to previously. For example, it is possible to use resin particles that are charged negative within a CMP slurry due to a functional group or groups which the resin itself has, e.g., a methacrylic resin such as polymethyl methacrylate (PMMA) or a phenolic resin. Each of the negatively charged resin particles electrostatically attracts a plurality of alumina particles that are not charged or charged positive so as to permit the alumina particles to be attached to the surface of the resin particle. Alternatively, it is possible to add a surfactant to a CMP slurry containing the resin particles and the alumina particles. The lipophilic portion of the surfactant is attached to the surface of the resin particle, and the alumina particles are attached to the hydrophilic portion of the surfactant. It follows that, in the case of using a surfactant, the alumina particles can be attached to the resin particles regardless of charging properties of the resin particles. Further, the alumina powder and the resin particles can be mixed in a dried state so as to permit the alumina powder to be thermally fused to the resin particles by utilizing the mechanofusion phenomenon.

In one embodiment of the present invention, the resin particles may be selected from the group consisting of methacrylic resin particles such as PMMA particles, phenolic resin particles, urea resin particles, melamine resin particles, polystyrene resin particles, polyacetal resin particles and polycarbonate resin particles. It is possible to use a plurality of different resin particles in combination.

In one embodiment of the present invention, the resin particles have an average primary particle diameter of 5 nm to 1,000 nm. If the resin particles have an average primary particle diameter of 5 nm or more, a more sufficient cushioning effect can be provided so as to suppress more effectively the scratch occurrence on an aluminum film. On the other hand, if the resin particles have an average primary particle diameter of 1,000 nm or less, the dispersibility of the resin particles in the slurry can be further improved.

In one embodiment of the present invention, the CMP slurry contains 0.01 to 5% by weight of the resin particles. If the resin particle content in the slurry is 0.01% by weight or more, it is possible to achieve a high polishing rate without lowering the polishing efficiency of the alumina powder. On the other hand, if the resin particle content in the slurry is 5% by weight or less, it is possible to achieve a high polishing rate without impairing the polishing achieved by the alumina particles.

In one embodiment of the present invention, the CMP slurry may contain an oxidizing agent, as required. The oxidizing agent is capable of improving the polishing rate. The oxidizing agent can be selected from the group consisting of hydrogen peroxide, ammonium peroxodisulfate, persulfuric acid, ammonium persulfate, phosphoric acid, nitric acid and diammonium cerium nitrate. These oxidizing agents can be used singly or in combination. The oxidizing agent may be contained in the CMP slurry in an amount of 0.1 to 5% by weight.

Also, in one embodiment of the present invention, a polishing rate improving agent may be added in place of or in addition to the oxidizing agent in order to improve the polishing rate. The polishing rate improving agent includes, for example, glycine, alanine and quinolinic acid. The polishing rate improving agent may be contained in the CMP slurry in an amount of 0.1 to 5% by weight.

Further, in one embodiment of the invention, the CMP slurry may contain a surfactant. As described previously, the surfactant can permit the alumina particles to be attached to the surface of the resin particle. In addition, the surfactant can improve the polishing rate of an aluminum film. The surfactant includes, for example, alkali metal salts of dodecylbenzenesulfonic acid (such as potassium salt and sodium salt), ammonium dodecylbenzenesulfonate, sodium dodecylsulfate, alkyldimethylbenzyl ammonium chloride, and potassium alkylnaphthalenesulfonate. The surfactant may be contained in the CMP slurry in an amount of 0.01 to 5% by weight.

In one embodiment of the invention, the CMP slurry is capable of polishing not only aluminum but also other damascene wiring materials such as copper, tungsten, alloys thereof, and alloys thereof with aluminum, producing advantages similar to those produced in the case of polishing aluminum as note above. In addition, in one embodiment of the invention, the CMP slurry is also capable of polishing a barrier (liner) material often deposited within a wiring groove or a contact (via) hole. In one embodiment of the present invention, the barrier material layer may be of a single layer structure or a laminate structure, formed of a barrier metal such as titanium, molybdenum, niobium, tantalum or vanadium, an alloy of two or more of these barrier metals, or nitrides, borides or oxides of these barrier metals. Since the CMP slurry according to one embodiment of the present invention is capable of polishing the barrier material, too, it is possible to polish the wiring metallic material layer and the barrier material layer in a single stage of the processing without employing a touch-up CMP step using, for example, a slurry of silica abrasive grains, which is employed in the prior art for removing the barrier material layer after polishing of the wiring metallic material layer by the main CMP treatment. Therefore, the disadvantage can be eliminated that the planarity of the polished surface achieved by the main CMP treatment is impaired by the touch-up CMP treatment.

The polishing of the wiring metallic material layer (and the barrier material layer) can be performed by using the ordinary CMP technique, except that the CMP slurry according to one embodiment of the present invention is used as the CMP slurry.

A method of manufacturing a semiconductor device according to one embodiment of the present invention comprises forming at least one recess (wiring groove and/or contact (via) hole) in an insulating layer formed above a semiconductor substrate. A layer of a wiring metallic material is formed over the insulating layer in a manner to fill the recess. Then, the wiring metallic material layer is polished by using the CMP slurry according to one embodiment of the present invention until that portion of the wiring metallic material layer which is positioned outside the recess is removed. The metallic material layer can be formed on a barrier material layer provided on the inner surface of the recess and on the insulating layer. As described previously, the barrier material layer can be polished successively after polishing of the wiring metallic material layer.

Figure 1B:
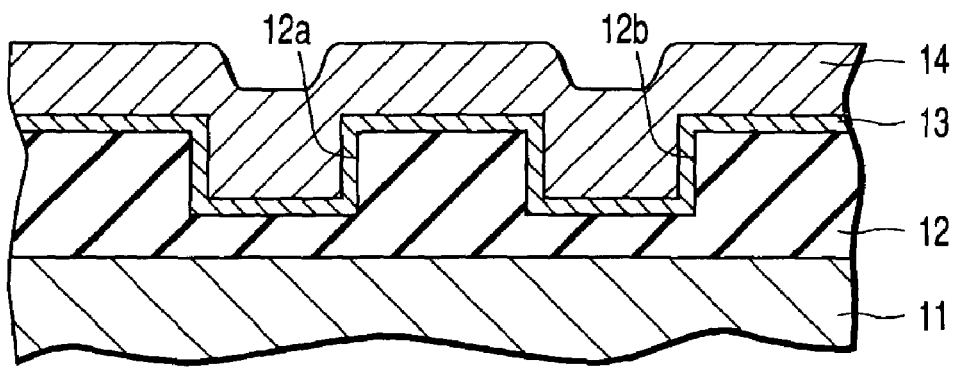
Figure 1C:
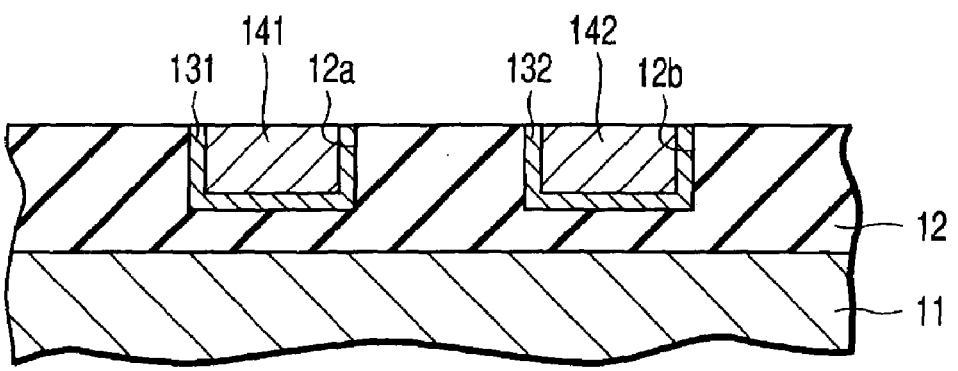

FIGS. 1A to 1C are cross-sectional views collectively showing a method of manufacturing a semiconductor device according to one embodiment of the present invention.

As shown in FIG. 1A, at least one wiring groove (two wiring grooves 13a and 13b can be seen in FIGS. 1A to 1C) is formed in an insulating layer 12 formed on a semiconductor substrate 11 such as a silicon substrate having various semiconductor elements. (not shown) integrated therein. The wiring groove may have a width of 0.12 to 100 μm and a depth of 0.1 to 2 μm, depending on a desired final semiconductor device manufactured. The insulating layer 12 can be formed of an inorganic insulating material or an organic insulating material. The inorganic insulating material includes, for example, silicon dioxide, a fluorine-added silicon dioxide (SiOF), and a porous hydrogenated silsesquioxane spin-on glass (HSQ-SOG). The organic insulating material includes, for example, a fluororesin such as polytetrafluoro ethylene (PTFE), a polyimide resin, a fluorine-added polyimide resin and benzocyclobutene (BCB). The insulating layer 12 can be formed to a thickness of 100 to 2,000 nm.

A layer 13 of a barrier material may be formed on the inner surfaces of the wiring grooves 12a and 12b and on the top surface of the insulating layer 12. The barrier material layer 13 can be formed to a thickness of 0.5 to 60 nm.

Next, a wiring metallic material is deposited to form a wiring material layer 14 over the top surface of the barrier material layer 13 in a manner to fill the wiring grooves 12a and 12b, as shown in FIG. 1B. In other words, the resultant wiring material layer 14 is formed not only in the grooves 12a and 12b, but also on the outside of the wiring grooves 12a and 12b. The wiring metallic material layer 14 can be formed by the known deposition method such as a sputtering method, a CVD method or a plating method. The wiring metallic material layer 14 can be formed to a thickness of 600 to 3,000 nm on the top surface of the insulating layer 12.

Then, a CMP treatment using a CMP slurry according to one embodiment of the present invention is applied to the wiring metallic material layer 14. The CMP technology itself is widely known in the art. Briefly, the semiconductor structure shown in FIG. 1B is disposed on a rotatable disk-like platen having a polishing pad disposed on its upper surface. The semiconductor substrate is disposed at a position deviant from the center of the platen such that the wiring metallic material layer of the semiconductor structure is brought into contact with the polishing pad. The semiconductor structure is held and pressurized by a pressurizing mechanism provided with a top ring capable of rotating the semiconductor structure under the state that the semiconductor wafer is held and pressurized. The platen and the top ring (and, hence, the semiconductor structure) are rotated in the same rotating direction at different speeds while supplying a CMP slurry from a point above the center of the platen onto the platen. Usually, the top ring is rotated in this stage at a rotating speed higher than the rotating speed of the platen. In general, the pressurizing force may be 100 to 500 gf/cm$^2$, the rotating speed of the top ring may be 10 to 150 rpm, the rotating speed of the platen may be 30 to 150 rpm, and the supplying flow rate of the CMP slurry may be 50 to 300 cc/min.

By the processing described above, the metal wiring material layer 14 is polished in a direction perpendicular to the top surface of the insulating layer 12. As described previously, the CMP slurry according to one embodiment of the present invention is also capable of polishing the barrier material layer 13. As a result, the metal wiring material layer 14 and the barrier material layer 13 can be polished in a single stage by the CMP treatment so as to expose the top surface of the insulating layer 12. The remaining wiring metallic material unremoved within the wiring grooves 12a and 12b after the CMP treatment forms wiring layers 141 and 142. Also, the remaining barrier material unremoved within the wiring grooves 12a and 1b after the CMP treatment forms barrier layers 131 and 132 positioned between the inner walls of the wiring grooves 12a, 12b and the buried wiring layers 141 and 142, respectively, as shown in FIG. 1C.

While various embodiments of the invention have been described above, the present invention should not be limited thereto. Needless to say, it is possible to employ a plurality of embodiments described above in combination.

The present invention will now be described with reference to Examples which follow. The present invention, however, is not limited to the following Examples.

EXAMPLE 1

In this Example, a silicon dioxide interlayer insulating layer was deposited by the method shown in FIGS. 1A to 1C on a silicon substrate having various semiconductor elements integrated therein. Wiring grooves each having a depth of 400 nm and a width of about 50 μm were formed in the insulating layer. The distance between the adjacent grooves was 9 μm. A barrier material layer consisting of niobium was deposited on the inner surfaces of the wiring grooves and on the surface of the insulating layer, followed by depositing an aluminum layer on the barrier material layer to a thickness of 800 nm as measured in the vertical direction from the bottom of the groove.

The aluminum layer and the barrier material layer were subjected to a CMP treatment. The CMP slurry used contained an alumina powder, 0.095% by weight of polymethyl methacrylate particles having an average primary particle diameter of 200 nm, 1% by weight of ammonium persulfate, 0.75% by weight of quinolinic acid, 1.0% by weight of glycine, 0.75% by weight of potassium dodecylbenzenesulfonate, and the balance of deionized water. The alumina powder used consisted of a mixture of α-alumina particles having an average primary particle diameter of 100 nm with γ-alumina particles having an average primary particle diameter of 50 nm, as shown in Table 1. The α-alumina particles were contained in the CMP slurry in an amount of 0.1% by weight, and the γ-alumina particles were contained in the CMP slurry in the CMP slurry in an amount of 0.4% by weight. In other words, the alumina powder was contained in the CMP slurry in a total amount of 0.5% by weight. The polishing was performed by using IC 1000/ SUBA 400 polishing pad commercially available from Rhodale Nitta Inc., and under the processing pressure of 450 gf/cm$^2$, the top ring rotating speed of 120 rpm, and the platen rotating speed of 100 rpm. The CMP slurry was supplied at a flow rate of 200 cc/min.

As a result, the aluminum layer portion and the barrier material layer portion on the top surface of the silicon dioxide insulating layer were removed. In this step, the polishing rate of the aluminum layer and the polishing rate of the Nb barrier material layer were measured. Table 2 shows the results. Also measured were the erosion of the aluminum layer and the surface defect of the polished surface, i.e., the number of scratches and the surface roughness in a 85% wiring pattern area having a width of 50 μm and a clearance of 9 μm, which was formed in a region of 5 mm square. The results are shown also in Table 2.

EXAMPLES 2–3 AND COMPARATIVE EXAMPLES 1–5

The procedure of Example 1 was repeated by using a CMP slurry similar to that used in Example 1, except that the alumina powder used was changed as shown in Table 1. The polishing rates of the aluminum layer and the Nb barrier layer, the erosion of the aluminum layer, and the surface defect of the polished surface were measured as in Example 1 The results are shown also in Table 2.

TABLE 1

| | Alumina powder | | | | | |
|---|---|---|---|---|---|---|
| | α-alumina particles | | Other alumina particles | | | |
| Example No. | Average primary particle diameter (nm) | Content (% by weight) | Crystal structure | Average primary particle diameter (nm) | Content (% by weight) | Resin particles |
| Example 1 | 100 | 0.1 | γ | 50 | 0.4 | PMMA |
| Example 2 | 100 | 0.1 | δ | 50 | 0.4 | PMMA |
| Example 3 | 100 | 0.1 | θ | 50 | 0.4 | PMMA |
| Comparative Example 1 | γ-alumina alone, δ-alumina alone, θ-alumina alone or α-alumina alone; Average primary particle diameter: 50 nm; Content: 0.5 wt % | | | | | None |
| Comparative Example 2 | γ-alumina alone; Average primary particle diameter: 50 nm; Content: 0.5 wt % | | | | | PMMA |
| Comparative Example 3 | δ-alumina alone; Average primary particle diameter: 50 nm; Content: 0.5 wt % | | | | | PMMA |
| Comparative Example 4 | γ-alumina alone; Average primary particle diameter: 50 nm; Content: 0.5 wt % | | | | | PMMA |
| Comparative Example 5 | α-alumina alone; Average primary particle diameter: 100 nm; Content: 0.5 wt % | | | | | PMMA |

TABLE 2

| Example No. | Polishing rate (nm/minute) Al | Polishing rate (nm/minute) Nb | Erosion (nm) | Surface defect The number of scratches | Surface defect Surface roughness (nm) |
|---|---|---|---|---|---|
| Example 1 | 617 | 20 | 35 | 1 | <1 |
| Example 2 | >600 | >20 | <40 | <3 | <1 |
| Example 3 | >600 | >20 | <40 | <3 | <1 |
| Comparative Example 1 | <200 | <10 | >70 | >100 | >10 |
| Comparative Example 2 | 697 | <10 | 22 | 31 | 2 |
| Comparative Example 3 | 650 | <10 | 35 | 23 | <1 |
| Comparative Example 4 | 600 | <10 | <40 | <30 | <1 |
| Comparative Example 5 | 412 | 22 | 70 | 1 | <1 |

As apparent from the data given in Table 2, in the system in which resin particles are not present together with alumina particles (Comparative Example 1), the polishing rate, the erosion, and the degree of the surface defect with respect to aluminum are substantially the same regardless of the crystal structure of alumina. However, in the system in which resin particles are present together with alumina particles (Comparative Examples 2 to 5), the polishing rate of aluminum (and the barrier material), the erosion, and the surface defect, particularly, the number of scratches, are significantly changed depending on the crystal structure of alumina. On the other hand, in the system in which resin particles are present together with the alumina powder wherein the alumina powder includes α-alumina particles and other alumina particles differing in the crystal structure from the α-alumina, it is possible to achieve practically sufficiently high levels simultaneously in respect of the polishing rate, the erosion and the surface defect, as apparent from Examples 1 to 3. Particularly, the number of scratches can be markedly decreased as apparent from Table 2.

EXAMPLE 4

Figure 2A:
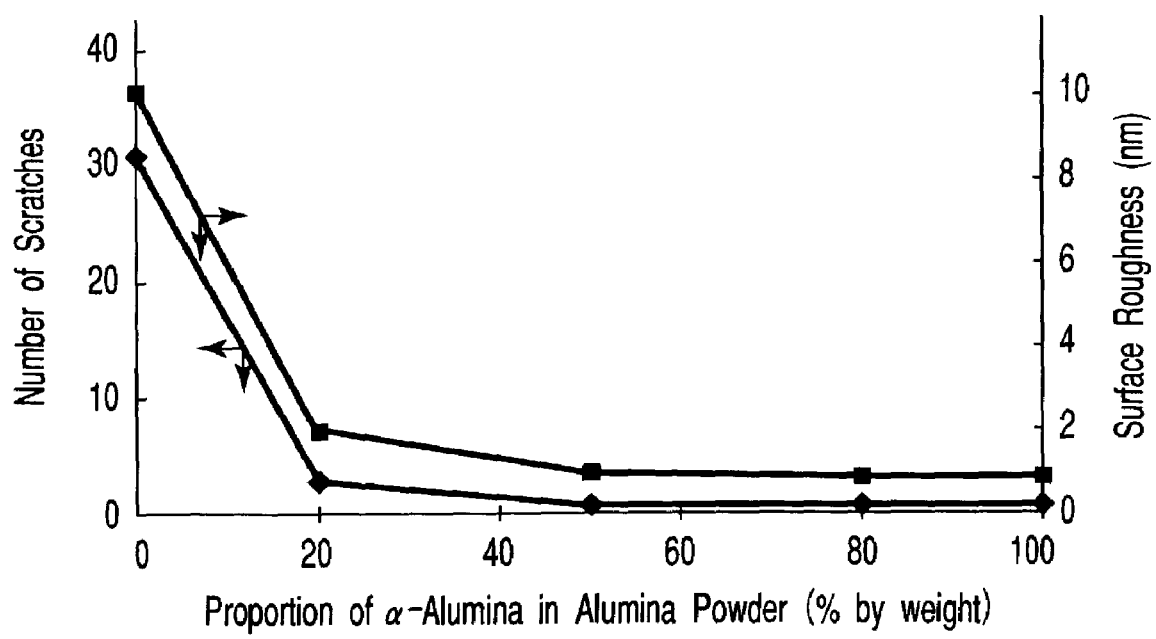
FIGS. 2A and 2B are graphs each showing the relationship between the proportion of α-alumina particles in the alumina powder contained in a CMP slurry and the polishing performance according to one embodiment of the present invention.
Figure 2B:
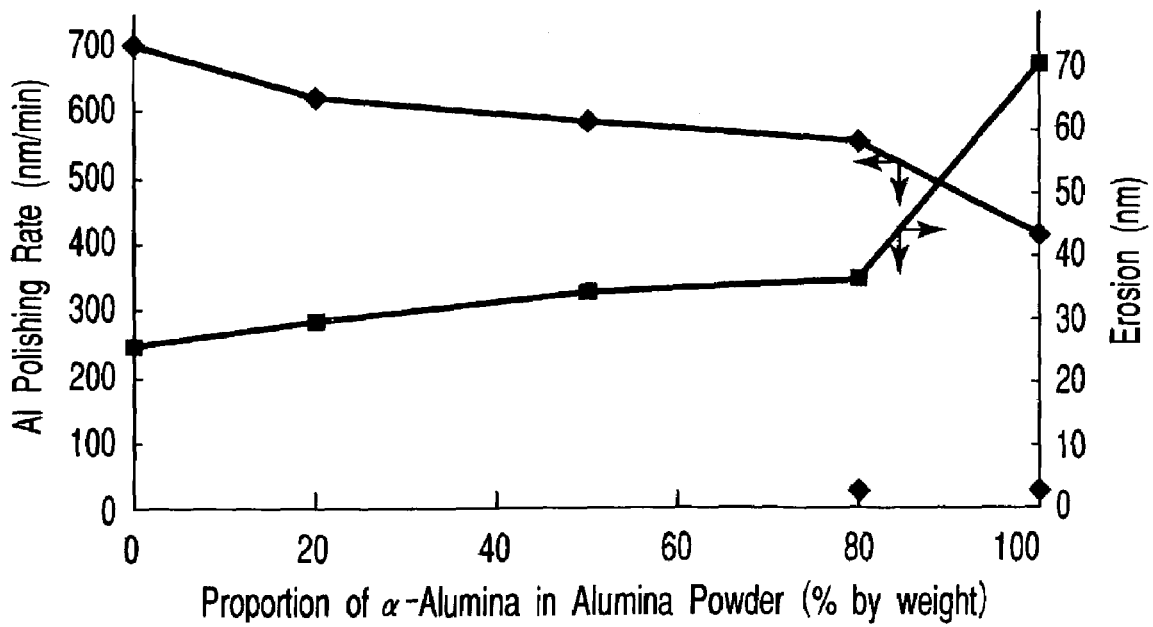

The procedure of Example 1 was repeated by using a CMP slurry having a composition equal to that of the CMP slurry used in Example 1, except that the proportion of the α-alumina particles in the alumina powder used (α-alumina/(α-alumina+γ-alumina)×100) was changed variously. Note that each CMP slurry used contained 0.5% by weight of the alumina powder. As in Example 1, the polishing rate of the aluminum layer, the erosion of the aluminum layer, and the surface defect of the polished surface were measured. FIGS. 2A and 2B are graphs each showing the results.

As apparent from FIGS. 2A and 2B, it is possible to achieve simultaneously a high polishing rate of aluminum, a low erosion, a small scratch, and a low surface roughness by setting the proportion of the α-alumina particles in the alumina powder at 20% to 80% by weight.

EXAMPLES 5–7 AND COMPARATIVE EXAMPLES 6–9

The procedure of Example 1 was repeated by using a CMP slurry having a composition equal to that of the CMP slurry used in each of Examples 1 to 3 and Comparative Examples 2 to 5, except that the resin particles used were changed to polystyrene particles having an average primary particle diameter of 200 nm. Note that each CMP slurry contained 0.095% by weight of polystyrene particles. Table 3 shows the details of the slurries used. As in Example 1, the polishing rate of the aluminum layer and the polishing rate of the Nb barrier layer were measured. Also, the erosion of the aluminum layer and the surface defect (the number of scratches and the surface roughness) of the polished surface were measured. Table 4 shows the results.

TABLE 3

| | Alumina powder | | | | | |
|---|---|---|---|---|---|---|
| | α-alumina particles | | Other alumina particles | | | |
| Example No. | Average primary particle diameter (nm) | Content (% by weight) | Crystal structure | Average primary particle diameter (nm) | Content (% by weight) | Resin particles |
| Example 5 | 100 | 0.1 | γ | 50 | 0.4 | Polystyrene |
| Example 6 | 100 | 0.1 | δ | 50 | 0.4 | Polystyrene |
| Example 7 | 100 | 0.1 | θ | 50 | 0.4 | Polystyrene |
| Comparative Example 6 | γ-alumina alone Average primary particle diameter: 50 nm; Content: 0.5 wt % | | | | | Polystyrene |
| Comparative Example 7 | δ-alumina alone Average primary particle diameter: 50 nm; Content: 0.5 wt % | | | | | Polystyrene |
| Comparative Example 8 | θ-alumina alone Average primary particle diameter: 50 nm; Content: 0.5 wt % | | | | | Polystyrene |
| Comparative Example 9 | α-alumina alone Average primary particle diameter: 100 nm; Content: 0.5 wt % | | | | | Polystyrene |

TABLE 4

| Example No. | Polishing rate (nm/minute) Al | Polishing rate (nm/minute) Nb | Erosion (nm) | Surface defect The number of scratches | Surface defect Surface roughness (nm) |
|---|---|---|---|---|---|
| Example 5 | >600 | >20 | <40 | <5 | <1 |
| Example 6 | >600 | >20 | <40 | <5 | <1 |
| Example 7 | >600 | >20 | <40 | <5 | <1 |
| Comparative Example 6 | >600 | <10 | <40 | 40 | <1 |
| Comparative Example 7 | >600 | <10 | <40 | 30 | <1 |
| Comparative Example 8 | >600 | <10 | <40 | 30 | <1 |
| Comparative Example 9 | 400 | >20 | >80 | <5 | <1 |

As apparent from Table 4, it was possible to achieve a high polishing rate, a good planarity, and a low defect density in each of Examples 5 to 7. In the case of using polystyrene particles, the number of scratches is rendered somewhat larger than that in the case of using PMMA particles because the polystyrene particles are somewhat harder than the PMMA particles. However, the scratch generation can be markedly suppressed in the case of using the polystyrene particles, compared with the case where resin particles are not used as in Comparative Example 1.

As described above in detail, embodiments of the present invention provides a CMP slurry capable of achieving simultaneously a high polishing rate of aluminum, a low erosion, and a small scratch and/or a small surface roughness and also provides a method of manufacturing a semiconductor device using the particular slurry.

Additional advantages and modifications will readily occur to those skilled in the art. Therefore, the present invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A chemical mechanical polishing slurry comprising:
   an alumina powder including α-alumina particles and at least one other alumina particles selected from the group consisting of γ-alumina particles, δ-alumina particles and θ-alumina particles; and
   resin particles,
   wherein the alumina particles are adhered to the resin particles.

2. The slurry according to claim 1, wherein the alumina powder contains the α-alumina particles in an amount of 20 to 80% by weight based on the total weight of the α-alumina particles and said at least one other alumina particles.

3. The slurry according to claim 1, wherein the alumina powder has an average primary particle diameter of 5 nm to 100 nm.

4. The slurry according to claim 1, which contains the alumina powder in an amount of 0.1 to 5% by weight.

5. The slurry according to claim 1, wherein the resin particles comprise at least one resin particles selected from the group consisting of methacrylic resin particles, phenolic resin particles, urea resin particles, melamine resin particles, polystyrene resin particles, polyacetal resin particles and polycarbonate resin particles.

6. The slurry according to claim 1, wherein the resin particles have an average primary particle diameter of 5 nm to 1,000 nm.

7. The slurry according to claim 1, which contains the resin particles in an amount of 0.01 to 5% by weight.

8. A method of manufacturing a semiconductor device, comprising:
   forming at least one recess in an insulating layer formed above a semiconductor substrate;
   forming a metallic material layer over the insulating layer, burying the recess; and
   polishing the metallic material layer by using a chemical mechanical polishing slurry until that portion of the metallic material layer which is positioned outside the recess is removed, forming a buried wiring layer comprising the metallic material buried in the recess,
   wherein the slurry comprises an alumina powder including α-alumina particles and at least one other alumina particles selected from the group consisting of γ-alumina particles, δ-alumina particles and θ-alumina particles, and resin particles,
   wherein the alumina particles are adhered to the resin particles.

9. The method according to claim 8, wherein the metallic material layer comprises aluminum, copper, tungsten or an alloy thereof.

10. The method according to claim 8, further comprising forming a barrier material layer between the insulating layer including the recess and the metallic material layer, wherein that portion of the barrier material layer which is positioned outside the recess is removed also by the slurry.

11. The method according to claim 10, wherein the barrier material layer comprises one of a layer made of a metal selected from the group consisting of titanium, molybdenum, niobium, tantalum and vanadium, a layer of an alloy containing said metal as a main component, a layer of a nitride, boride or oxide of said metal, and a combination of at least two of these layers.

12. The method according to claim 8, wherein the alumina powder contains the α-alumina particles in an amount of 20 to 80% by weight based on the total weight of the α-alumina particles and said at least one other alumina particles.

13. The method according to claim 8, wherein the alumina powder has an average primary particle diameter of 5 nm to 100 nm.

14. The method according to claim 8, wherein the slurry contains the alumina powder in an amount of 0.1 to 5% by weight.

15. The method according to claim 8, wherein the resin particles comprise at least one resin particles selected from the group consisting of methacrylic resin particles, phenolic resin particles, urea resin particles, melamine resin particles, polystyrene resin particles, polyacetal resin particles and polycarbonate resin particles.

16. The method according to claim 8, wherein the resin particles have an average primary particle diameter of 5 nm to 1,000 nm.

17. The method according to claim 8, wherein the slurry contains the resin particles in an amount of 0.01 to 5% by weight.

18. The method according to claim 8, wherein the slurry is an aqueous slurry.

* * * * *